United States Patent
Wight

(10) Patent No.: US 6,836,183 B2
(45) Date of Patent: Dec. 28, 2004

(54) CHIREIX ARCHITECTURE USING LOW IMPEDANCE AMPLIFIERS

(75) Inventor: James Stuart Wight, Ottawa (CA)

(73) Assignee: IceFyre Semiconductor Corporation, Kanata (CA)

( * ) Notice: Subject to any disclaimer, the term of this patent is extended or adjusted under 35 U.S.C. 154(b) by 0 days.

(21) Appl. No.: 10/272,725

(22) Filed: Oct. 16, 2002

(65) Prior Publication Data

US 2004/0075492 A1 Apr. 22, 2004

(51) Int. Cl.[7] .......................... H03F 3/68; H03F 3/217
(52) U.S. Cl. ................................ 330/124 R; 330/251
(58) Field of Search ........................ 330/10, 124 R, 330/207 A, 251, 295, 165, 195

(56) References Cited

U.S. PATENT DOCUMENTS

| | | |
|---|---|---|
| 2,220,201 A | 11/1940 | Bliss |
| 2,624,041 A | 12/1952 | Evans, Jr. |
| 3,170,127 A | 2/1965 | Cramer .................. 332/41 |
| 5,621,351 A * | 4/1997 | Puri et al. .............. 330/10 |
| 6,133,788 A | 10/2000 | Dent |
| 6,285,251 B1 * | 9/2001 | Dent et al. ........... 330/124 R |

FOREIGN PATENT DOCUMENTS

| EP | 0011464 | 5/1980 |
|---|---|---|
| WO | WO08204507 | 12/1982 |

OTHER PUBLICATIONS

Conradi, C. P. et al., *Evaluation of a Lossless Combiner in a LINC Transmitter*, Proceedings of the 1999 IEEE Canadian Conference on Electrical Computer Engineering, May 9–12, 1999, pp. 105–110.

Sokal, N. O., *RF Power Amplifiers, Classes A though S—How they Operate, and When to Use Each*, Electronics Industries Forum of New England, 1997, Professional Program Proceedings, Boston, MA, May 6–8, 1997, New York, NY, IEEE, May 6, 1997, pp. 179–252.

PCT International Search Report dated Feb. 9, 2004.

* cited by examiner

Primary Examiner—Steven J. Mottola
(74) Attorney, Agent, or Firm—Testa, Hurwitz & Thibeault, LLP

(57) ABSTRACT

Circuits and methods for use in amplifying amplitude and phase modulated signals. A circuit uses a combiner with dual parallel signal amplifiers feeding it. The signal amplifiers have a low output impedance while the combiner does not provide any isolation between its inputs from the signal amplifiers. As in other Chireix architectures, the signals from the signal amplifiers are phase modulated prior to being fed to the combiner. The combiner then combines these two signals and, depending on how these two signals are combined, the resulting output of the combiner is amplitude modulated. The signal amplifiers may be Class D or Class F amplifiers to provide high efficiency amplification of the signals.

12 Claims, 3 Drawing Sheets

CHIREIX ARCHITECTURE USING LOW IMPEDANCE AMPLIFIERS

FIELD OF THE INVENTION

The present invention relates to signal processing and is particularly applicable but not limited to circuits for amplifying amplitude and phase modulated signals.

BACKGROUND TO THE INVENTION

The communications revolution of the 1990's has led to an increasing need for further and better means of transporting both data and voice communications. One offshoot of this revolution has been the burgeoning growth in wireless communications as more and more data is being transmitted by wireless means. For wireless handsets, wireless PDAs (personal digital assistants), and other wireless devices, one overarching concern is power consumption—the less power a device consumes the more desirable it is. To this end, higher efficiency components, such as amplifiers, are desirable in these wireless devices.

One type of architecture which was used in the past but has fallen out of recent favor is the so called Chireix architecture. First suggested by Henry Chireix in 1935, the technique also known as "outphasing" involves separately phase modulating two signals and recombining them in a combiner or combining network. By judiciously adjusting the phase modulation of the two signals, the combined resulting signal can become amplitude modulated as well as phase modulated. This technique enables the use of saturated amplifiers or switching amplifiers for amplitude modulated signals.

Also called "ampliphase" by the RCA Corporation when used in some of their radio transmitters, the technique has recently fallen out of favor due to its seeming inapplicability when amplifying signals. Previous attempts used common forms of linear and saturating amplifiers such as Class A and Class AB amplifiers to try and amplify the two signals prior to their being combined. Unfortunately, these efforts have yielded unacceptable results as the resulting circuits were found to be insufficiently efficient. A Chireix based architecture, if properly working with sufficient efficiency, would offer advantages in not only power consumption but in other areas as well.

Based on the above, there is a need for, methods or circuits which overcome or at least mitigate the drawback of the prior art. Such a solution should provide the advantages of a Chireix or outphasing architecture while providing sufficient amplification efficiency to be useful.

SUMMARY OF THE INVENTION

The present invention provides circuits and methods for use in amplifying amplitude and phase modulated signals. A circuit uses a combiner with dual parallel signal amplifiers feeding it. The signal amplifiers have a low output impedance while the combiner does not provide any isolation between its inputs from the signal amplifiers. As in other Chireix architectures, the signals from the signal amplifiers are phase modulated prior to being fed to the combiner. The combiner then combines these two signals and, depending on how these two signals are phase modulated, the resulting output of the combiner is amplitude modulated as well as phase modulated. The signal amplifiers may be Class D or Class F amplifiers to provide high efficiency amplification of the signals.

In a first aspect, the present invention provides a circuit for providing amplification to signals, the circuit comprising:
   a signal combiner;
   at least two signal amplifiers each receiving and amplifying a signal, said signal amplifiers being coupled in parallel to said combiner, each of said signal amplifiers acting as a voltage source and having a low output impedance,
wherein
   each signal received and amplified by each of said signal amplifiers is phase modulated;
   outputs of each of said signal amplifiers are added by said combiner to produce a resulting signal; and
   amplitude modulation and phase modulation of said resulting signal from said combiner is achieved by an addition of said outputs.

In a second aspect, the present invention provides a circuit for providing amplification to signals, the circuit comprising:
   at least two signal amplifiers each receiving and amplifying a signal and each producing an amplifier output and acting as a voltage source; and
   an signal combiner receiving each of said amplifier outputs in parallel, said signal combiner providing no isolation between said amplifier outputs,
wherein
   each signal received and amplified by each of said signal amplifiers is phase modulated;
   said amplifier outputs are added by said combiner to produce a resulting signal; and
   amplitude modulation of said resulting signal from said combiner is achieved by an addition of said amplifier outputs.

BRIEF DESCRIPTION OF THE INVENTION

A better understanding of the invention will be obtained by considering the detailed description below, with reference to the following drawings in which.

DETAILED DESCRIPTION

Figure 1:
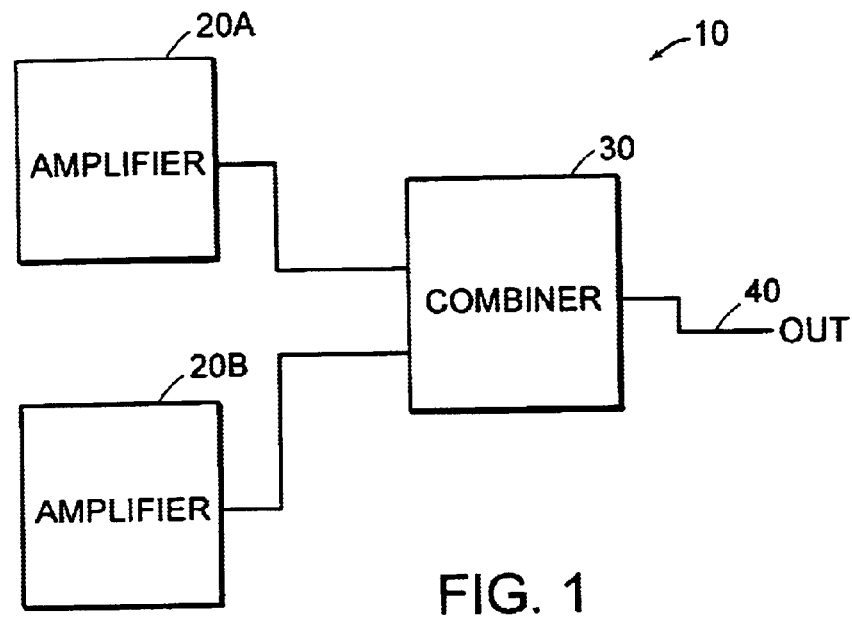
FIG. 1 is a block diagram of an amplifier system using a Chireix architecture according to one aspect of the invention.

Referring to FIG. 1, a block diagram of a circuit 10 according to one aspect of the invention is illustrated. Signal amplifiers 20A, 20B feed a combiner 30 which produces an output 40. The signal amplifiers 20A, 20B are low output impedance amplifiers while the combiner 30 is a combiner appropriate for Chireix architectures.

As in well known Chireix architectures, the signals received and amplified by the signal amplifiers 20a, 20B are phase modulated signals. These phase modulated signals, after being amplified by the signal amplifiers 20A, 20B, are combined or added by the combiner 30 to result in the output signal 40. By judiciously phase modulating the signals using appropriate phase modulators (not shown), the resulting signal 40 from the addition of the two signals is an amplitude modulated signal. Not only that, but the resulting signal is, in effect, an amplified version of a phase and an amplitude modulated signal.

It should be noted that similar architectures as that illustrated in FIG. 1 have been attempted in the past. However, the low efficiency of the circuitry of the previous attempts stem from their use of low efficiency amplifiers such as Class A and Class AB amplifiers which have significant output impedances. Such linear and saturating amplifiers did not respond correctly to the dynamic adjustment of the load impedance being presented to them due to their significant output impedance.

The dynamic nature of the load impedance is a result of the appropriate combiner for a Chireix architecture. Such an appropriate combiner not only reinserts the amplitude modulation to the resulting signal 40, it also provides a dynamic adjustment of the load impedance presented to each one of the signal amplifiers. This outphasing adjustment of the load impedance is such that the DC current through each signal amplifier decreases as the combined output amplitude decreases thereby maintaining high efficiency.

Figure 2:
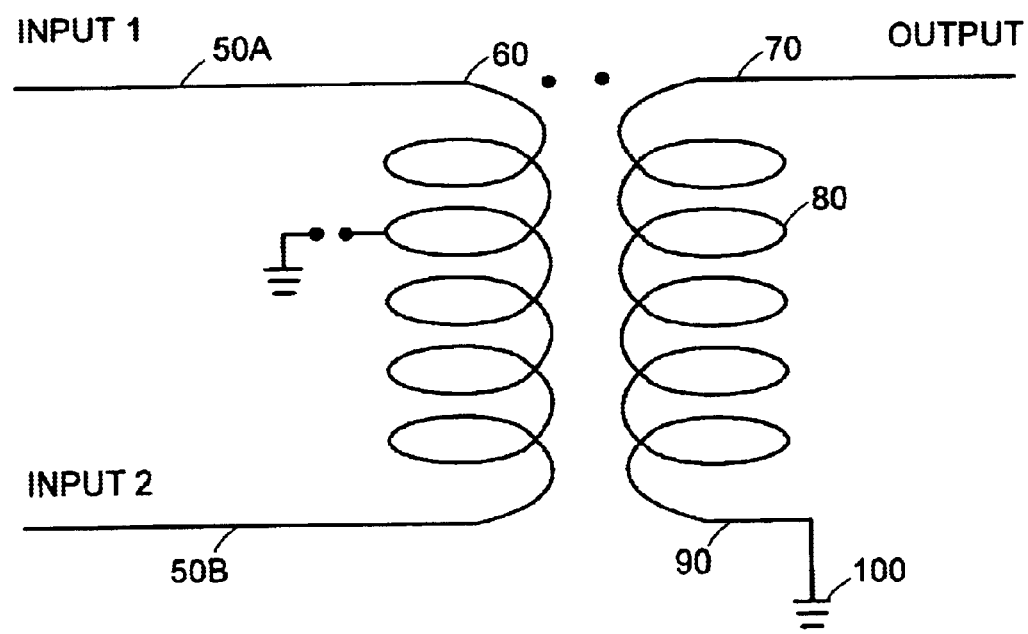
FIG. 2 is a block diagram of a modified balanced magnetic transformer which may be used as a combiner in the system of FIG. 1.
Figure 3:
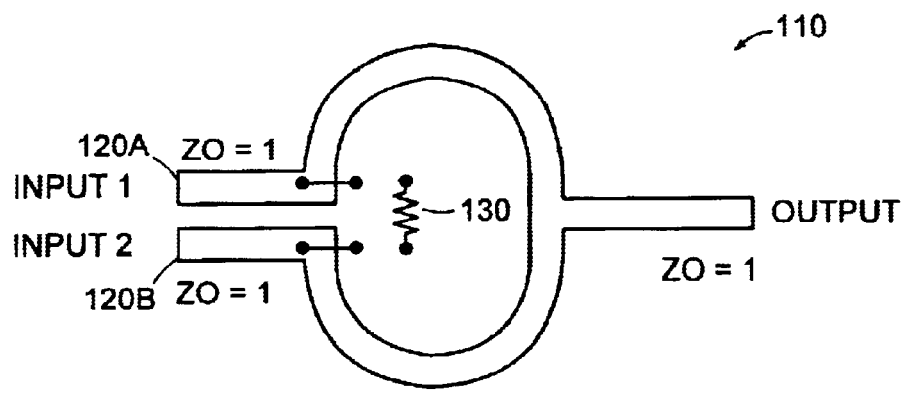
FIG. 3 is a block diagram of a modified Wilkinson combiner which may be used as a combiner in the system of FIG. 1.

Two appropriate combiners are illustrated in FIGS. 2 and 3. FIG. 2 illustrates a modified balanced magnetic transformer. As is known in the art, magnetic transformer combiners normally have a center tap-to-ground connection. In the modified transformer of FIG. 2, the tap-to-ground connection is not present. As can be seen, each of the two terminals 50A, 50B of an input winding 60 is to be coupled to a signal input or, in this case, a corresponding output of a corresponding signal amplifier. The output 70 is taken from one terminal of the output winding 80 while the other terminal 90 is coupled to ground 100.

Another appropriate combiner is a modified Wilkinson combiner 110 as illustrated in FIG. 3. As is known, a Wilkinson combiner has an isolating resistor which is normally coupled between the inputs. In the modified Wilkinson combiner of FIG. 3, neither of the inputs 120A, 120B are coupled to the isolating resistor 130. This isolating resistor is effectively not present in the modified combiner of FIG. 3. The resistor 130 is provided merely for illustration. Other than this modification relating to the non-coupled resistor 130, the modified Wilkinson combiner 110 is similar in couplings and characteristics to other well known Wilkinson combiners.

Figure 4:
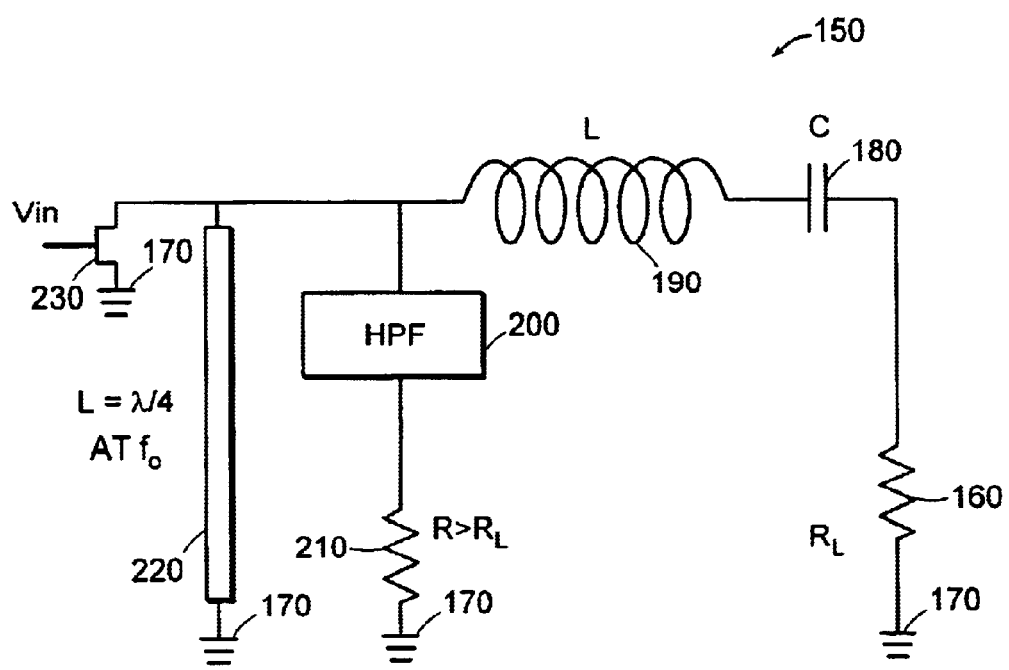
FIG. 4 is a block diagram of a Class-F power amplifier which may be used as an amplifier in the system of FIG. 1.

Regarding a proper choice of amplifiers for use in the block diagram of FIG. 1, it has been found by the inventors that either Class D or Class F power amplifiers can correctly respond to the dynamic nature of the load impedance as mentioned above. These Class D or Class F power amplifiers provide the desirably very low output impedances that allows the Chireix architecture to amplify both phase and amplitude modulated signals. Such a Class F power amplifier is illustrated in FIG. 4. This Class F amplifier 150 consists of a resistor load 160 coupled between ground 170 and a capacitor 180. An inductor 190 also coupled in series with the capacitor 180 forms a resonator which passes the fundamental harmonic of the signal to resistor load 160. Between the inductor 190 and ground are coupled, in series, a high pass filter 200 and another resistor 210. The resistor 210 has a much higher resistance value than the load resistor 160. A shorted, quarter wave transmission line 220 effectively shorts all even harmonic voltages while all odd harmonic voltages, including the fundamental, are passed on. A switching voltage input 230 is provided through a transistor 230.

As is known, Class F amplifiers provide a good approximation to a voltage square-wave across the output terminals of a device by "shorting" all even-harmonic voltages and "supporting" all odd-harmonic voltages. As a result, the voltage waveform across the output terminals of a device contains only odd-harmonic components. In addition, this sorting of odd- and even-harmonics results in a current passing through the output terminals of the device that contains the fundamental, and only even-harmonic components.

This "shorting" and "supporting" of harmonics is conveniently achieved with a shorted quarter-wave shunt-stub connected across the device's output terminals, a shown in FIG. 4. The stub will "short" the even harmonics and "support" the odd harmonics. Since each harmonic will contain only a voltage component or a current component, the device will not absorb power, except at the fundamental.

In a practical situation, with a stub effectively shorting only the second harmonic voltage, and passing only the fundamental and third harmonic voltage, the power-added efficiency can be more than 85%.

Figure 5:
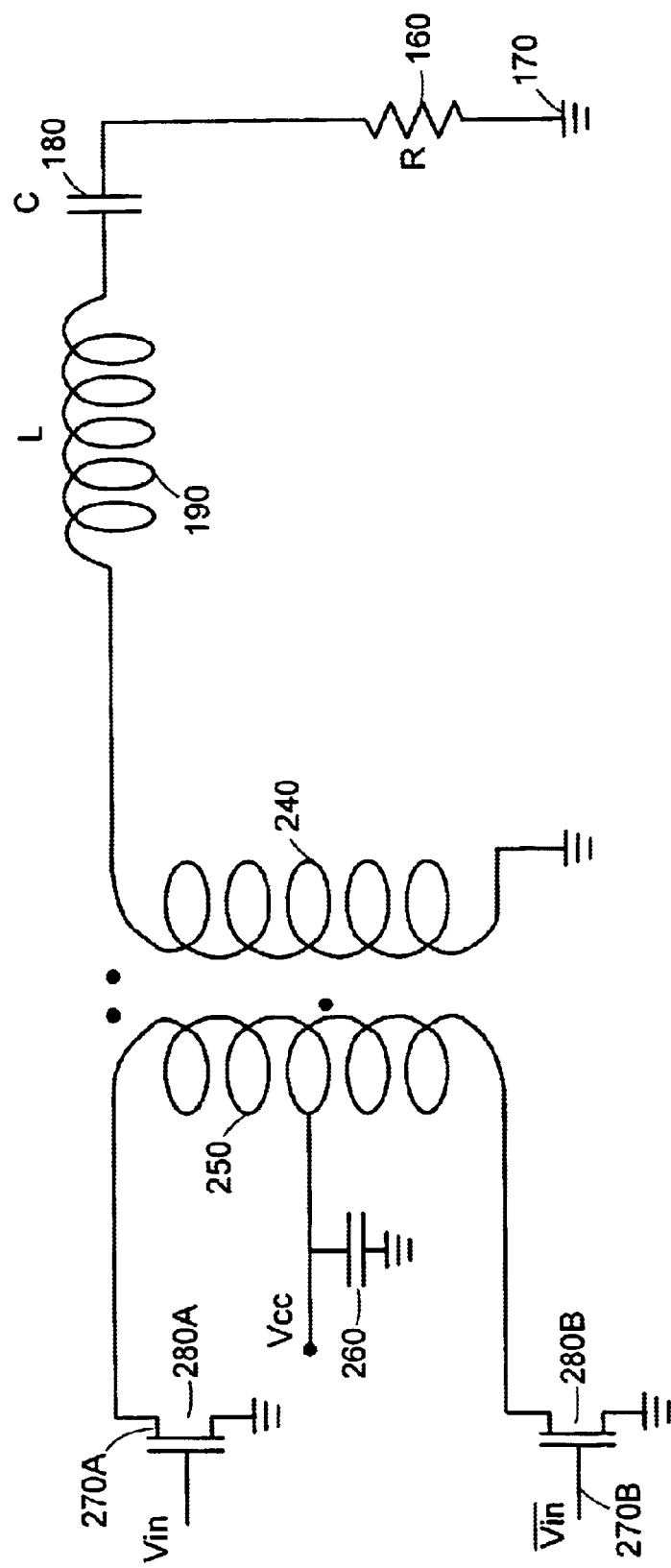
FIG. 5 is a block diagram of a Class-D power amplifier which may also be used as an amplifier in the system of FIG. 1.

As an example of a Class D amplifier which may be used with the invention, FIG. 5 illustrates a block diagram of a Class D amplifier. As can be seen, the Class D amplifier is somewhat similar in structure to the Class F amplifier of FIG. 4. Inductor 190, capacitor 180 and resistor load 160 form a series circuit. The inductor 190 is coupled in series with one end of a transformer coil 240 while the other end of the transformer coil 240 is coupled to ground 170. The other transformer coil 250 is tapped by a voltage source (Vcc) coupled to a grounded capacitor 260. This other transformer coil 250 is coupled at each end to a switching voltage input 270A, 270B by way of transistors 280A, 280B.

For such Class D (voltage switching) amplifiers, the active device passes no current between its output terminals when the voltage across its output terminals is at the voltage rail, and passes maximum current between its output terminals when the voltage across its output terminals is zero. As a result, the device does not absorb any power, and all power taken from the bias supply is converted into the output signal (100% power-added efficiency).

It should be noted that the amplifiers in the amplifier pair 20A, 20B in FIG. 1 are to be of the same type. As such, if one amplifier 20A is a Class D amplifier, the other amplifier 20B should also be a Class D amplifier. Similarly, if one amplifier is a Class F amplifier, the other should also be a Class F amplifier. These two amplifier classes provide the requisite switch mode operation along with the very low output impedance. Other amplifier classes may have the switch mode operation but their output impedance is not of the desired very low value.

It should also be noted that while the circuit of FIG. 1 only illustrates two signal amplifiers in parallel, multiple signal amplifiers may be used in parallel with an appropriate combiner. Such a configuration may use multiple parallel signal amplifiers of the same type or class, with all parallel signal amplifiers feeding a single multiple input port combiner. However, as noted above, these multiple signal amplifiers are to have the requisite switch mode operation and the low output impedance. Ideally, such a multiply parallel arrangement would only use Class D or Class F power amplifiers.

A person understanding this invention may now conceive of alternative structures and embodiments or variations of the above all of which are intended to fall within the scope of the invention as defined in the claims that follow.

What is claimed is:

1. A circuit for providing amplification to signals, the circuit comprising:
    a signal combiner, wherein said combiner is a modified balanced magnetic transformer, said transformer being devoid of a center tap to ground connection;
    at least two signal amplifiers each receiving and amplifying a signal, said signal amplifiers being coupled in parallel to said combiner, each of said signal amplifiers having a low output impedance and acting as a voltage source,
wherein
    each signal received and amplified by each of said signal amplifiers is phase modulated;
    outputs of each of said signal amplifiers are added by said combiner to produce a resulting signal, said signal amplifier outputs being coupled to terminals of an input winding of said transformer; and
    amplitude modulation of said resulting signal from said combiner is achieved by an addition of said outputs.

2. A circuit according to claim 1 wherein said combiner provides minimum isolation between said outputs of said signal amplifiers.

3. A circuit according to claim 1 wherein said combiner provides no isolation between said outputs of said signal amplifiers.

4. A circuit according to claim 1 wherein each of said amplifiers has switch mode operation.

5. A circuit according to claim 4 wherein each of said amplifiers is chosen from a group comprising:
    class D signal amplifiers; and
    class F signal amplifiers.

6. A circuit according to claim 1 wherein all of said at least two signal amplifiers are of the same type.

7. A circuit for providing amplification to signals, the circuit comprising:
    at least two signal amplifiers each receiving and amplifying a signal and each producing an amplifier output; and
    a signal combiner receiving each of said amplifier outputs in parallel, said signal combiner providing no isolation between said amplifier outputs,
wherein
    each signal received and amplified by each of said signal amplifiers is phase modulated;
    said signal combiner is a modified balanced magnetic transformer, said transformer being devoid of a center tan to ground connection;
    said amplifier outputs are added by said combiner to produce a resulting signals,
    said amplifier outputs being coupled to terminals of an input winding of said transformer; and
    amplitude modulation of said resulting signal from said combiner is achieved by an addition of said amplifier outputs.

8. A circuit according to claim 7 wherein each of said signal amplifiers has a very low output impedance.

9. A circuit according to claim 8 wherein each of said signal amplifiers has switch mode operation.

10. A circuit according to claim 9 wherein each of said signal amplifiers is chosen from a group comprising:
    class D signal amplifiers; and
    class F signal amplifiers.

11. A circuit according to claims 7 wherein each of said signal amplifiers is chosen from a group comprising:
    class D signal amplifiers; and
    class F signal amplifiers.

12. A circuit according to claim 7 wherein all of said at least two signal amplifiers are of the same type.

* * * * *